(12) United States Patent
Chang et al.

(10) Patent No.: US 9,048,312 B2
(45) Date of Patent: Jun. 2, 2015

(54) SEMICONDUCTOR DEVICE AND METHOD FOR FORMING THE SAME

(71) Applicant: VANGUARD INTERNATIONAL SEMICONDUCTOR CORPORATION, Hsinchu (TW)

(72) Inventors: Hsiung-Shih Chang, Taichung (TW); Jui-Chun Chang, Hsinchu (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 36 days.

(21) Appl. No.: 14/025,416

(22) Filed: Sep. 12, 2013

(65) Prior Publication Data

US 2015/0069503 A1   Mar. 12, 2015

(51) Int. Cl.
*H01L 29/76* (2006.01)
*H01L 29/78* (2006.01)
*H01L 29/66* (2006.01)
*H01L 29/40* (2006.01)

(52) U.S. Cl.
CPC ...... *H01L 29/7813* (2013.01); *H01L 29/66734* (2013.01); *H01L 29/402* (2013.01)

(58) Field of Classification Search
CPC ............ H01L 29/7802; H01L 29/1095; H01L 29/0696; H01L 29/7813; H01L 29/0634; H01L 29/4236; H01L 21/28273
USPC ........... 257/330, 331, 341; 438/259, 270, 283
See application file for complete search history.

(56) References Cited

U.S. PATENT DOCUMENTS

2006/0006386 A1*   1/2006   Hirler et al. ................... 257/60

* cited by examiner

*Primary Examiner* — Quoc Hoang
(74) *Attorney, Agent, or Firm* — Birch, Stewart, Kolasch & Birch, LLP

(57) ABSTRACT

A semiconductor device including a substrate having an active region is disclosed. A field-plate region and a bulk region are in the active region, wherein the bulk region is at a first side of the field-plate region. At least one trench-gate structure is disposed in the substrate corresponding to the bulk region. At least one source-doped region is in the substrate corresponding to the bulk region, wherein the source-doped region surrounds the trench-gate structure. A drain-doped region is in the substrate at a second side opposite to the first side of the field-plate region, wherein an extending direction of length of the trench-gate structure is perpendicular to that of the drain-doped region as viewed from a top view perspective.

20 Claims, 7 Drawing Sheets

SEMICONDUCTOR DEVICE AND METHOD FOR FORMING THE SAME

BACKGROUND OF THE INVENTION

1. Field of the Invention

The present invention relates to a semiconductor device, and in particular, to a semiconductor device having a trench gate and a method for forming the same.

2. Description of the Related Art

Technology that includes high-voltage elements is implemented to integrated circuits with high voltages and high power. In order to achieve high-withstand voltage and high current, the flow of the driving current in a conventional power transistor is developed from a horizontal direction to a vertical direction. A metal oxide semiconductor field-effect transistor (MOSFET) having a trench gate has been developed that is capable of effectively reducing on-resistance (Ron) and processing high currents.

FIG. 1 is a top view of a conventional metal oxide semiconductor field-effect transistor having a trench gate. The metal oxide semiconductor field-effect transistor comprises a substrate 500. A drain-doped region 510, a trench-gate structure 520 and source-doped regions 530 are in the substrate 500. The source-doped regions 530 are at two sides of the trench-gate structure 520. The source-doped regions 530 and the trench-gate structure 520 are connected to each other and have the same length, but the trench-gate structure 520 has a depth that is greater than that of the source-doped regions 530. An extending direction of length of the trench-gate structure 520 is parallel to that of the drain-doped region 510 as viewed from a top view perspective. The driving current of the metal oxide semiconductor field-effect transistor flows from the drain-doped region 510 towards the source-doped regions 530 and the trench-gate structure 520, and further flows up to the source-doped regions 530 along a sidewall of the trench-gate structure 520. Accordingly, the gate channel width w of the metal oxide semiconductor field-effect transistor is the length of the trench-gate structure 520.

When the gate channel length is fixed, the amount of driving current is proportional to the above-mentioned gate channel width. However, if the gate channel width is increased, the length of the trench-gate structure 520 is also increased, thereby increasing the size of the semiconductor device.

Thus, there exists a need in the art for development of a semiconductor device having a trench gate and a method for forming the same capable of mitigating or eliminating the aforementioned problems.

BRIEF SUMMARY OF INVENTION

A detailed description is given in the following embodiments with reference to the accompanying drawings. Semiconductor device and method for forming the same are provided.

An exemplary embodiment of a semiconductor device according to the invention is provided. The semiconductor device comprises a substrate having an active region. A field-plate region and a bulk region are in the active region, wherein the bulk region is at a first side of the field-plate region. At least one trench-gate structure is disposed in the substrate corresponding to the bulk region. At least one source-doped region is in the substrate corresponding to the bulk region, wherein the source-doped region(s) surrounds the trench-gate structure(s). A drain-doped region is in the substrate at a second side opposite to the first side of the field-plate region, wherein the extending direction of length of the trench-gate structure(s) is perpendicular to that of the drain-doped region as viewed from a top view perspective.

An exemplary embodiment of a method for forming a semiconductor device according to the invention is provided. The method for forming a semiconductor device comprises providing a substrate having an active region, wherein a field-plate region and a bulk region are in the active region, and the bulk region is at a first side of the field-plate region. At least one trench-gate structure and at least one source-doped region are formed in the substrate corresponding to the bulk region, wherein the source-doped region(s) surrounds the trench-gate structure(s). A drain-doped region is formed in the substrate at a second side opposite to the first side of the field-plate region, wherein an extending direction of length of the trench-gate structure(s) is perpendicular to that of the drain-doped region as viewed from a top view perspective.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
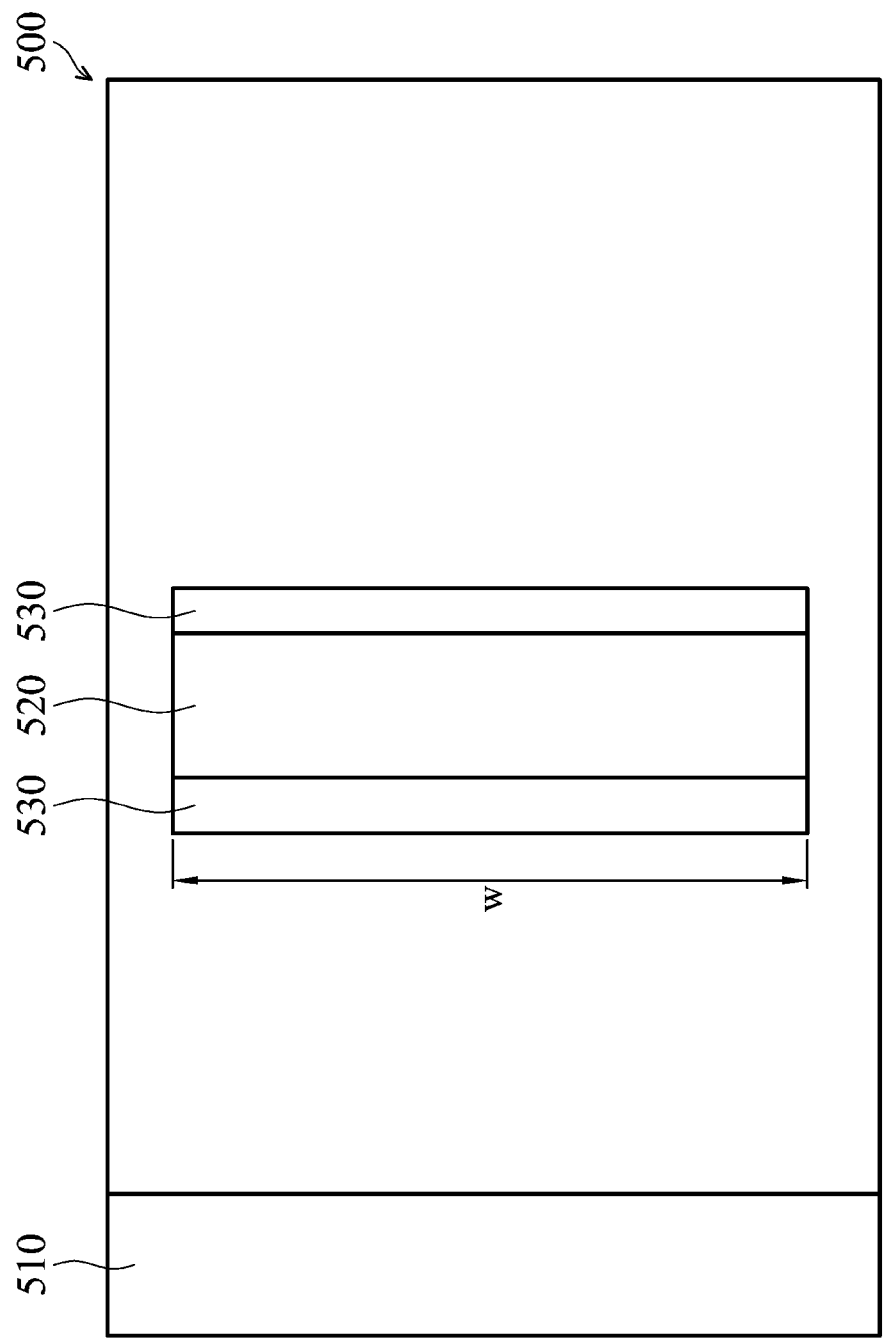
FIG. 1 is a top view of a conventional metal oxide semiconductor field-effect transistor having a trench gate.

The following description is of a mode for carrying out the invention. This description is made for the purpose of illustrating the general principles of the invention and should not be taken in a limiting sense. The scope of the invention is best determined by reference to the appended claims. Moreover, the same or similar elements in the drawings and the description are labeled with the same reference numbers.

Figure 3A:
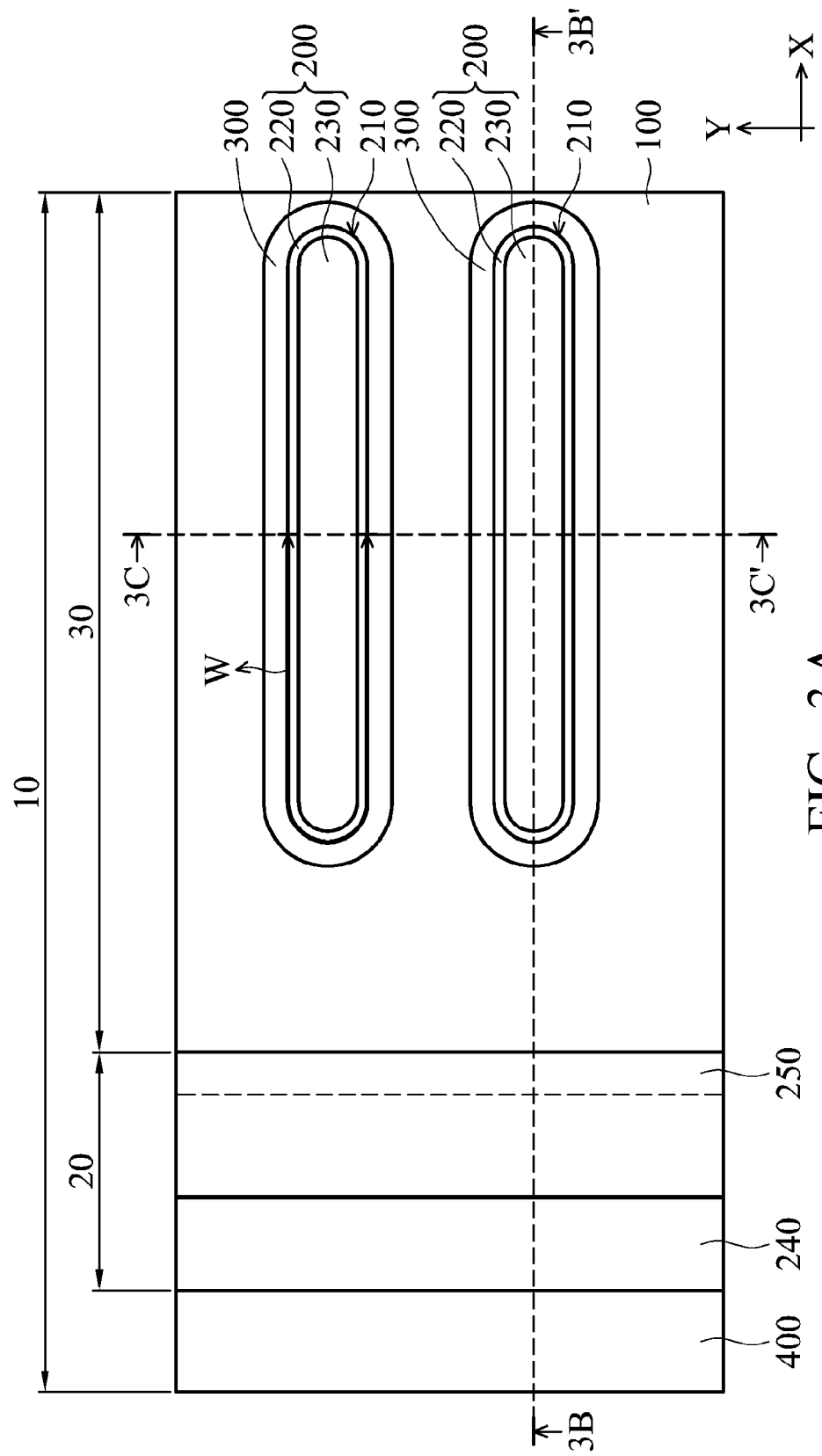
Figure 3B:
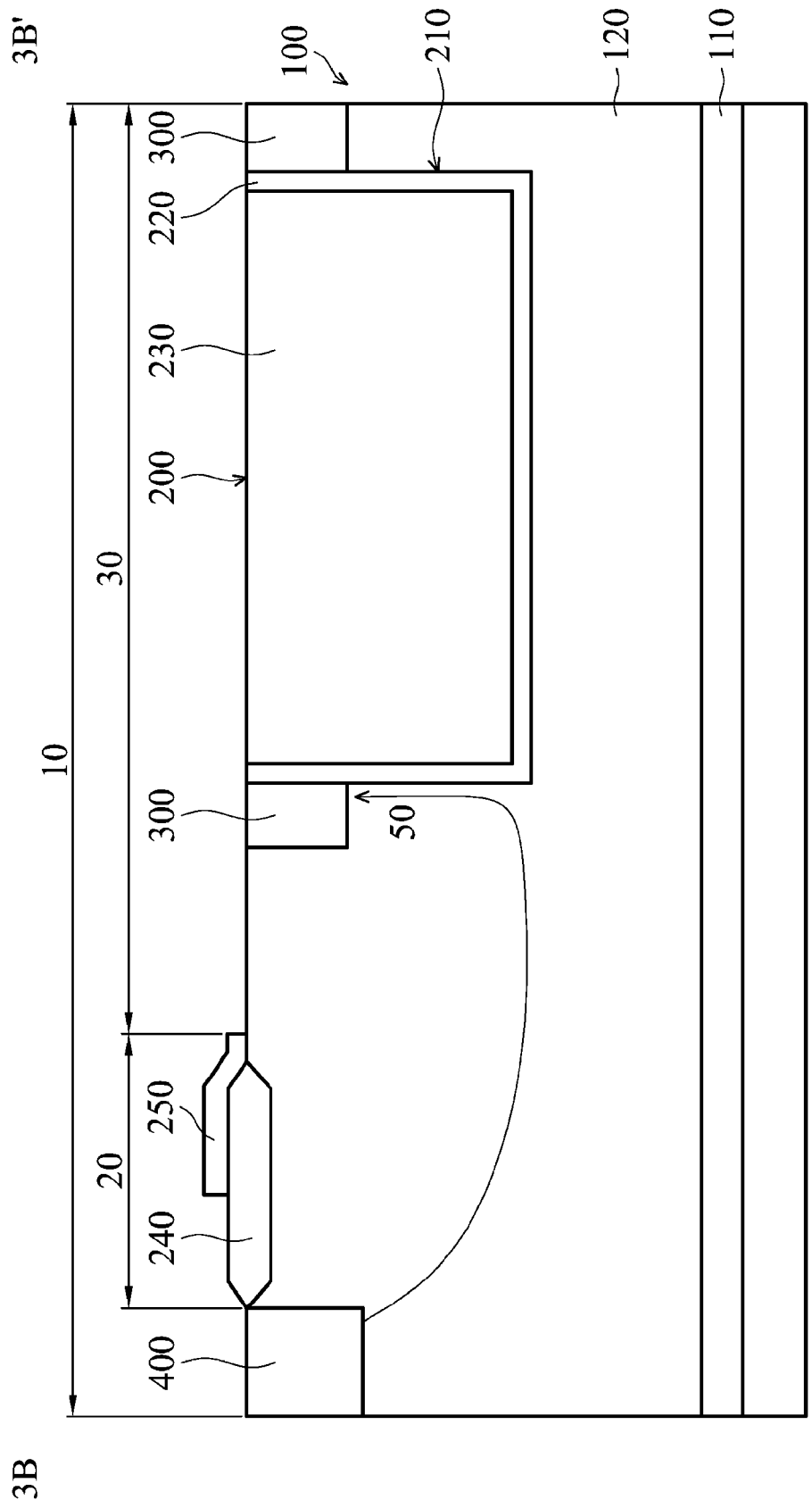
FIG. 3B is a cross-sectional view along the line 3B-3B' in FIG. 3A.
Figure 3C:
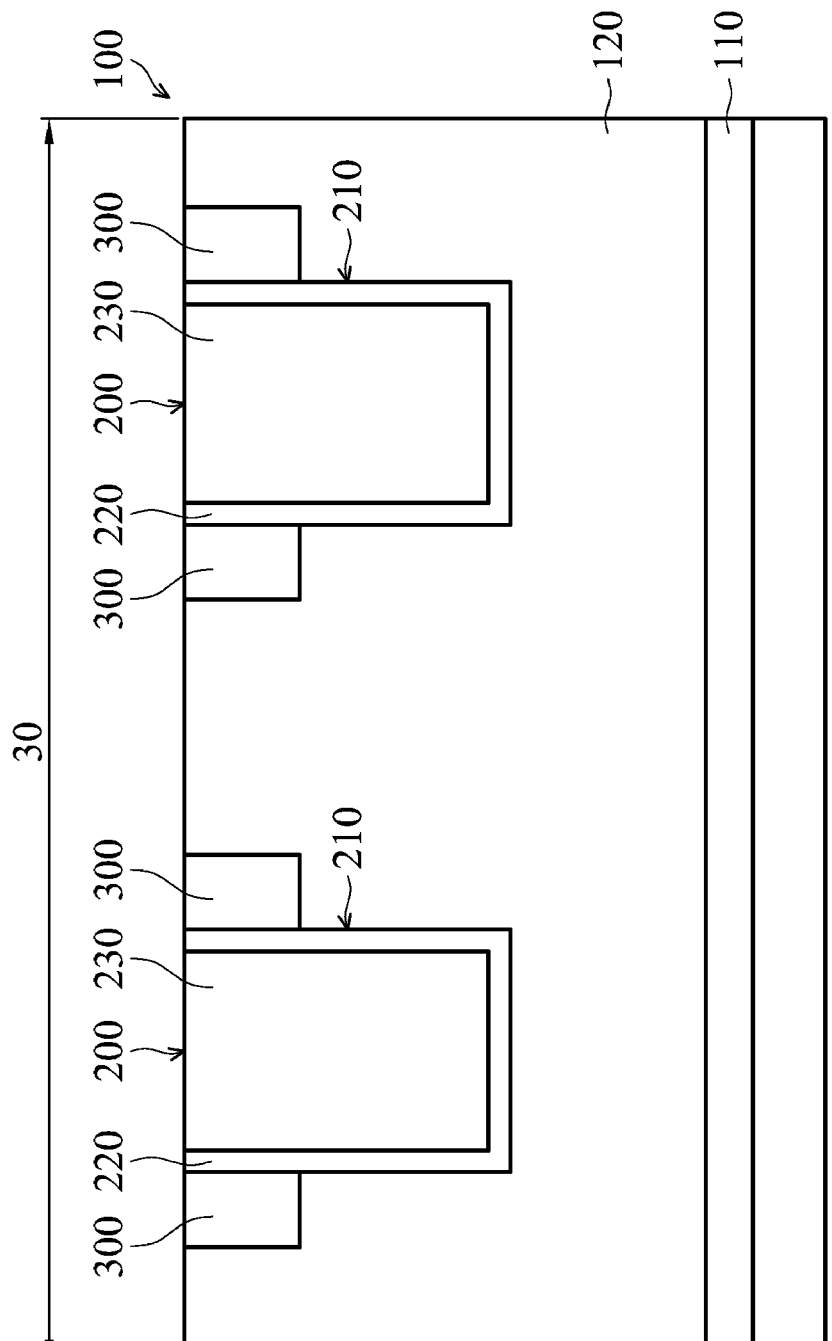
FIG. 3C is a cross-sectional view along the line 3C-3C' in FIG. 3A.

An exemplary embodiment of a semiconductor device having trench gates according to the invention is illustrated with FIGS. 3A to 3C, wherein FIG. 3A is top view of an exemplary embodiment of a semiconductor device according to the invention, FIG. 3B is a cross-sectional view along the line 3B-3B' in FIG. 3A, and FIG. 3C is a cross-sectional view along the line 3C-3C' in FIG. 3A.

A semiconductor device having trench gates comprises a substrate 100, at least one trench-gate structure 200, at least one source-doped region 300 and a drain-doped region 400. The substrate 100 has an active region 10. A field-plate region 20 and a bulk region 30 are in the active region 10, wherein the bulk region 30 is at a first side of the field-plate region 20. In the embodiment, the substrate 100 may be a silicon-on-insulator (SOI) substrate and comprise a buried oxide (BOX) layer 110 and a silicon layer 120 thereon, as shown in FIGS. 3B and 3C. In other embodiments, the substrate 100 may be a single crystal silicon substrate, an epitaxial crystal silicon substrate, a silicon germanium substrate, a compound semiconductor substrate or another semiconductor substrate known and used in the art. In the embodiment, the conductivity type of the substrate 100 is n-type, but it is not limited thereto. In other embodiments, the conductivity type of the substrate 100 is p-type and may be determined according to design demands.

At least one trench-gate structure 200 is disposed in the substrate 100 corresponding to the bulk region 30, and comprises a dielectric layer 220 and a gate-electrode layer 230. The dielectric layer 220 is conformally formed in a trench 210 in the substrate 100. The gate-electrode layer 230 is on the dielectric layer 220 and fully fills the trench 210, as shown in FIGS. 3B and 3C. The dielectric layer 220 may comprise oxide, nitride, nitrogen oxide, combinations thereof or other suitable gate dielectric materials. The gate-electrode layer 230 may comprise silicon, polysilicon or other electrically conductive materials. In the embodiment, the trench-gate structure 200 is an elongated pillar, and the bottom surface of the pillar is rounded rectangular, as shown in FIG. 3A. In other embodiments, the bottom surface of the pillar of the trench-gate structure 200 may be oval, rectangular or polygonal (not shown).

Source-doped regions 300 are in the substrate 100 corresponding to the bulk region 30, wherein the source-doped regions 300 surround the trench-gate structure 200, as shown in FIG. 3A. In the embodiment, the conductivity type of the source-doped region 300 is n-type, but it is not limited thereto. In other embodiments, the conductivity type of the source-doped region 300 is p-type and may be determined according to design demands. For example, the source-doped region 300 may comprise p-type dopants, such as boron or boron fluoride, or n-type dopants, such as phosphorous or arsenic. In the embodiment, as viewed from a top view perspective, sides of the source-doped regions 300 and the trench-gate structure 200 have the same shape, as shown in FIG. 3A. In other embodiments, the sides of the source-doped regions 300 and the trench-gate structure 200 may have different shapes (not shown).

In one embodiment, the semiconductor device having trench gates may comprise a plurality of trench-gate structures 200 and a plurality of corresponding source-doped regions 300, and the trench-gate structures 200 are spaced apart from each other. For example, the semiconductor device having trench gates comprises two trench-gate structures 200 spaced apart from each other and two corresponding source-doped regions 300, and the trench-gate structures 200 have the same shape, as shown in FIG. 3A. In another embodiment, the trench-gate structures 200 may have different shapes (not shown). In other embodiments, the trench-gate structures 200 of more than two trench-gate structures 200 may have the same shape or different shapes, and may have the same pitch or different pitches between the adjacent trench-gate structures. It is realized that the number and shape of the trench-gate structures 200 and the corresponding source-doped regions 300 shown in FIGS. 3A to 3C are used as an example and not limited thereto. The actual number and shape of the trench-gate structures 200 and the corresponding source-doped regions 300 are determined by design demands.

A drain-doped region 400 is in the substrate 100 at a second side opposite to the first side of the field-plate region 20. Namely, the drain-doped region 400 and the bulk region 30 having the trench-gate structures 200 and the source-doped regions 300 are at two opposite sides of the field-plate region 20, respectively. The trench-gate structures 200 have the same pitch between each trench-gate structure 200 and the drain-doped region 400. In the embodiment, the conductivity type of the drain-doped region 400 is p-type, but it is not limited thereto. In other embodiments, the conductivity type of the drain-doped region 400 is n-type and may be determined according to design demands. For example, the drain-doped region 400 may comprise p-type dopants, such as boron or boron fluoride, or n-type dopants, such as phosphorous or arsenic. In the embodiment, as viewed from a top view perspective, the extending direction of length of the trench-gate structure 200 (i.e., X-direction) is perpendicular to that of the drain-doped region 400 (i.e., Y-direction), as shown in FIG. 3A.

In the embodiment, the semiconductor device having trench gates further comprises a field-oxide layer 240, such as a local oxidation of silicon (LOCOS), and a field electrode 250. The field-oxide layer 240 is in the substrate 100 corresponding to the field-plate region 20 and protrudes out of the substrate 100. The field electrode 250 is on the field-oxide layer 240 and extends onto the substrate 100 corresponding to the bulk region 30, as shown in FIGS. 3A and 3B.

The driving current 50 of the semiconductor device having trench gates flows from the drain-doped region 400 through below the field-oxide layer 240, and further flows up to at least one corresponding source-doped region 300 along the sidewalls of at least one trench-gate structure 200, as the arrow shows in FIG. 3B. In the embodiment, the gate channel width W of the semiconductor device having trench gates is half of the perimeter of the bottom surface of an elongated pillar of the trench-gate structure 200, as shown in FIG. 3A.

The conventional metal oxide semiconductor field-effect transistor having a trench gate has only one trench-gate structure 520. The extending direction of length of the trench-gate structure 520 is parallel to that of the drain-doped region 510, as shown in FIG. 1. The gate channel width w of the metal oxide semiconductor field-effect transistor having a trench gate is the length of the trench-gate structure 520. If the gate channel width w is increased, the area of the semiconductor device will be increased proportionally.

Compared to the conventional metal oxide semiconductor field-effect transistor having a trench gate, the semiconductor device according to the invention has one trench-gate structure 200 or a plurality of trench-gate structures 200 spaced apart from each other. The extending direction of length of the trench-gate structure 200 is substantially perpendicular to that of the drain-doped region 400. The gate channel width W of the semiconductor device is half of the perimeter of the bottom surface of the elongated pillar of the single trench-gate structure 200 or the sum of that of the plurality of trench-gate structures 200.

Accordingly, compared to the trench-gate structure having an extending direction of length parallel to that of the drain-doped region, when the device area is fixed, a trench-gate structure is arranged to have an extending direction of length substantially perpendicular to that of the drain-doped region, a plurality of trench-gate structures could be formed and spaced apart from each other in the semiconductor device. As a result, the gate channel width would be increased to be the sum of half of the perimeter of the bottom surface of the plurality of trench-gate structures. Therefore, the device area would be used effectively, thereby improving the driving current.

According to the foregoing embodiments, a trench-gate structure has an extending direction of length substantially perpendicular to that of the drain-doped region, and the gate channel width W of the semiconductor device is half of the perimeter of the bottom surface of the elongated pillar of the single trench-gate structure. Therefore, the gate channel width of the trench-gate structure would be significantly improved by partially increasing the device area, thereby improving the driving current and on-resistance. Additionally, when the device area is partially increased, since a plurality of trench-gate structures could be formed and spaced apart from each other in the semiconductor device, the driving current and on-resistance would be further improved and the device area used would be effectively increased. More precisely, according to the embodiments of the trench-gate structures, the size of the gate structure is decreased and the device area used is increased with the same required driving current. Accordingly, the size of the semiconductor device is decreased.

Figure 2A:
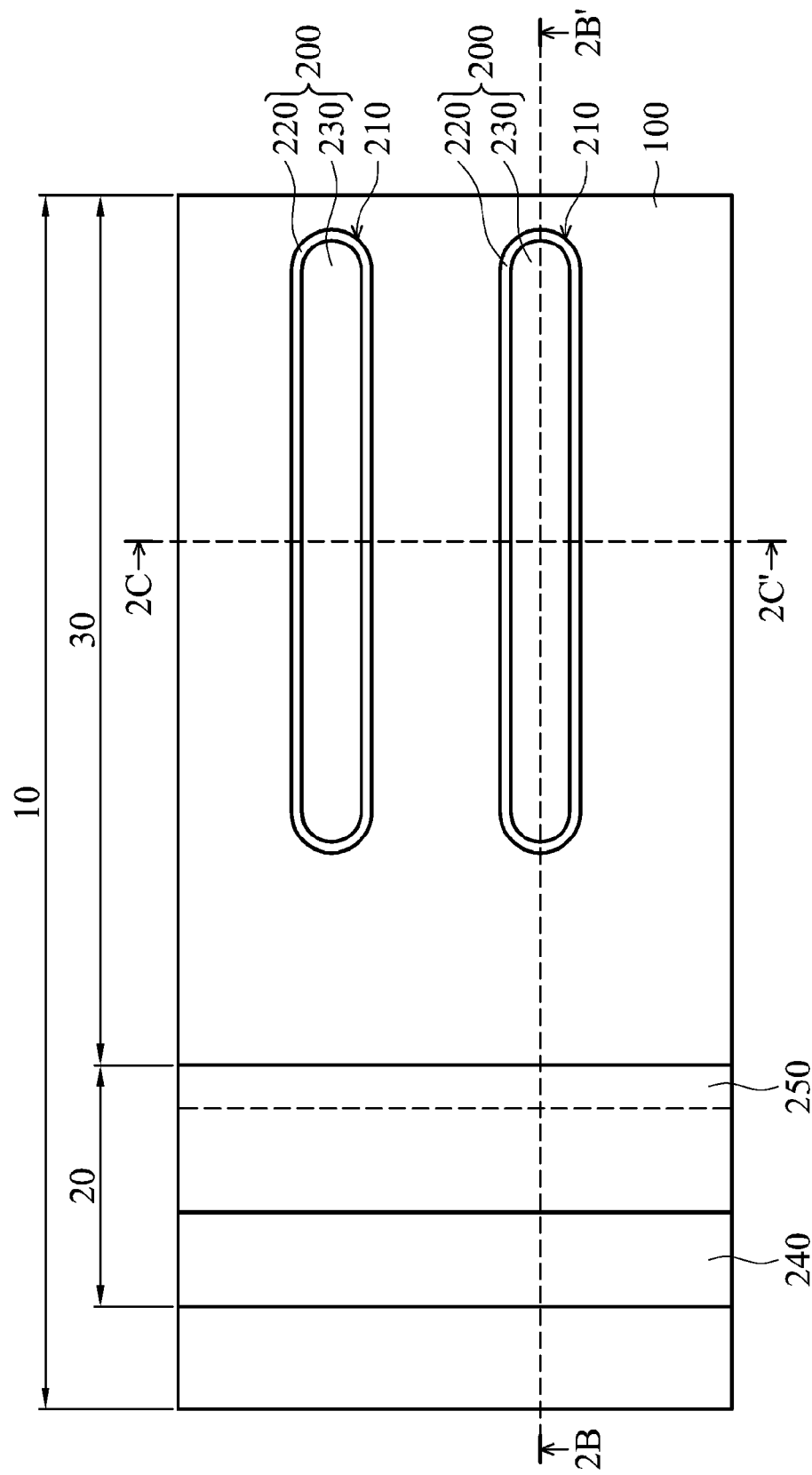
FIGS. 2A and 3A are top views of an exemplary embodiment of a method for forming a semiconductor device according to the invention.
Figure 2B:
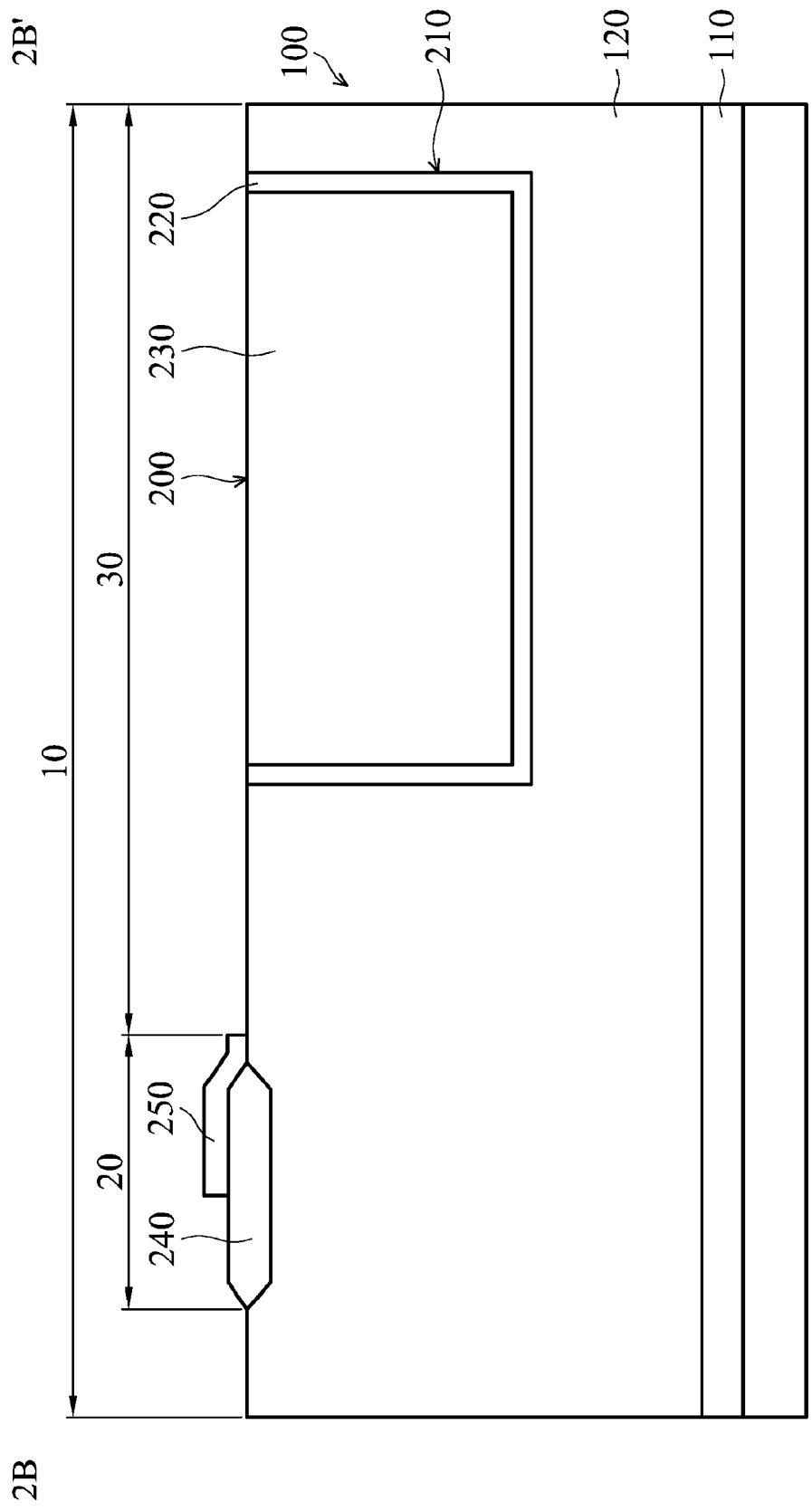
FIG. 2B is a cross-sectional view along the line 2B-2B' in FIG. 2A.
Figure 2C:
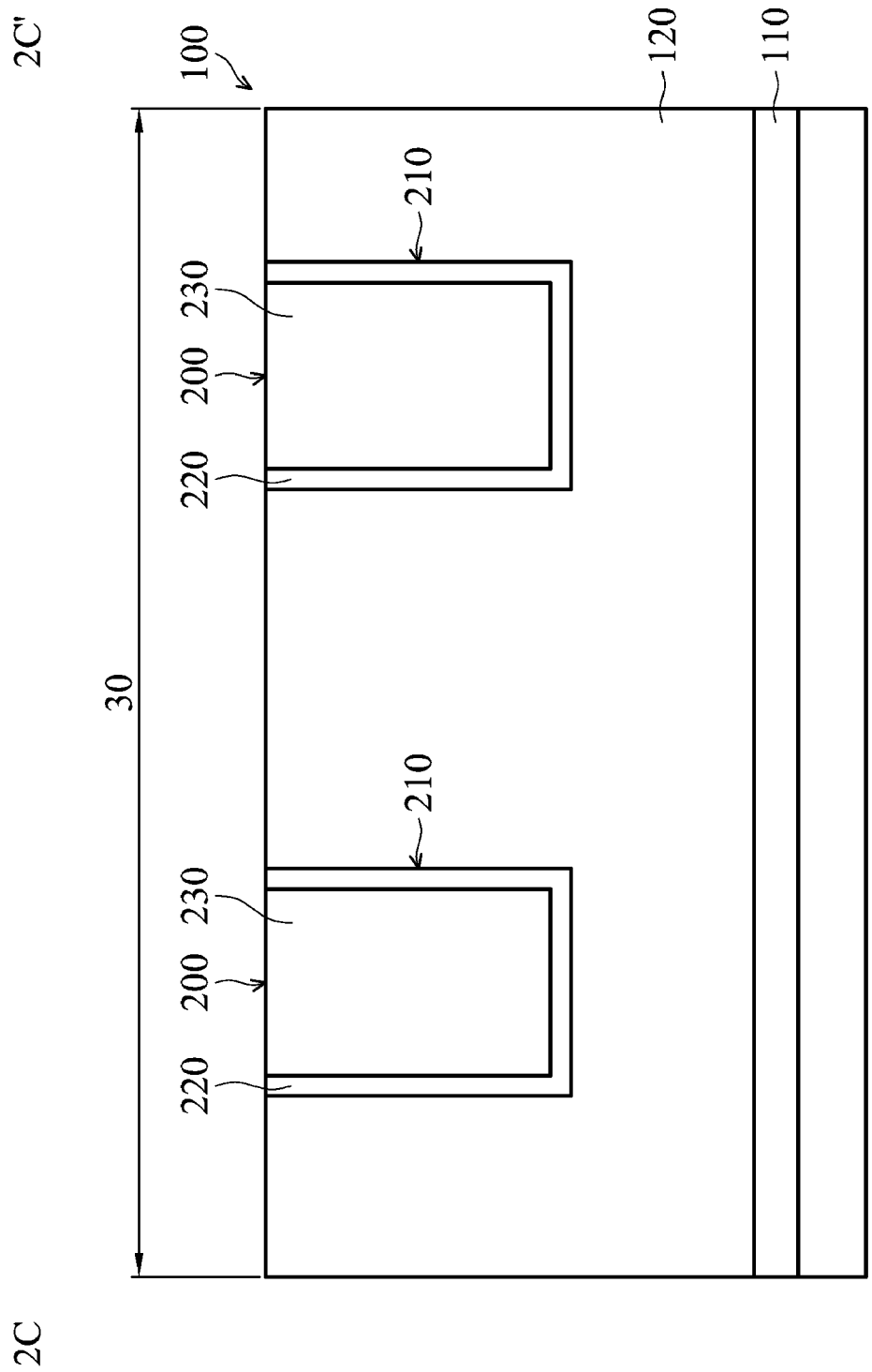
FIG. 2C is a cross-sectional view along the line 2C-2C' in FIG. 2A.

An exemplary embodiment of a method for forming a semiconductor device having trench gates according to the invention is illustrated with FIGS. 2A to 2C and 3A to 3C, wherein FIGS. 2A and 3A are top views of an exemplary embodiment of a method for forming a semiconductor device according to the invention. FIG. 2B is a cross-sectional view along the line 2B-2B' in FIG. 2A, and FIG. 2C is a cross-sectional view along the line 2C-2C' in FIG. 2A. FIG. 3B is a cross-sectional view along the line 3B-3B' in FIG. 3A, and FIG. 3C is a cross-sectional view along the line 3C-3C' in FIG. 3A.

Referring to FIGS. 2A to 2C, a substrate 100 having an active region 10 is provided. A field-plate region 20 and a bulk region 30 are in the active region 10, wherein the bulk region 30 is at a first side of the field-plate region 20. In the embodiment, the substrate 100 may be a silicon-on-insulator substrate and comprise a buried oxide layer 110 and a silicon layer 120 thereon, as shown in FIGS. 2B and 2C. In other embodiments, the substrate 100 may be a single crystal silicon substrate, an epitaxial crystal silicon substrate, a silicon germanium substrate, a compound semiconductor substrate or another semiconductor substrate known and used in the art. In the embodiment, the conductivity type of the substrate 100 is n-type, but it is not limited thereto. In other embodiments, the conductivity type of the substrate 100 is p-type and may be determined according to design demands.

A patterned hard mask (not shown), such as a silicon nitride layer, may be formed on the substrate 100 by deposition process and lithography and etching processes to expose the substrate 100 corresponding to the field-plate region 20. Next, a field-oxide layer 240, such as a local oxidation of silicon, is formed in the substrate 100 corresponding to the field-plate region 20 and protrudes out of the substrate 100 by an oxide growth process.

After the hard mask is removed, another patterned hard mask (not shown) may be formed on the substrate 100 by a deposition process and lithography and etching processes to expose the substrate 100 at a first side of the field-plate region 20. Next, an etching process, such as a dry etching process, a wet etching process, a plasma etching process, a reactive ion etching process or another known etching process, is performed to form at least one trench 210 in the substrate 100 at the first side of the field-plate region 20 (i.e., the bulk region 30). For example, two trenches 210 are formed in the substrate 100. Next, after the hard mask is removed, a dielectric material may be conformally deposited in each trench 210 by a deposition process, such as an atomic layer deposition (ALD), a chemical vapor deposition (CVD), a physical vapor deposition (PVD), a thermal oxide process or another suitable process, to correspondingly form a dielectric layer 220 as a gate dielectric layer. The dielectric layer 220 may comprise oxide, nitride, nitrogen oxide, a combination thereof, or another suitable gate dielectric material.

Next, a conductive material may be deposited on the dielectric layer 220 and fully fill the corresponding trench 210 by a deposition process, such as a physical vapor deposition, a chemical vapor deposition, an atomic layer deposition, a sputter process or a coating process, to form a gate-electrode layer 230. Therefore, two trench-gate structures 200 are formed in the substrate 100 corresponding to the bulk region 30, as shown in FIGS. 2B and 2C. The gate-electrode layer 230 may comprise silicon, polysilicon or another electrically conductive material. In addition, a field electrode 250 may be formed on the field-oxide layer 240 and extend onto the substrate 100 by a deposition process, as shown in FIGS. 2A and 2B.

In the embodiment, the trench-gate structure 200 is an elongated pillar, and the bottom surface of the pillar is rounded rectangular, as shown in FIG. 2A. In other embodiments, the bottom surface of the pillar of the trench-gate structure 200 may be oval, rectangular or polygonal (not shown).

According to the embodiment, the semiconductor device having trench gates may comprise a plurality of trench-gate structures 200 spaced apart from each other. For example, the semiconductor device having trench gates comprises two trench-gate structures 200 spaced apart from each other, and the trench-gate structures 200 have the same shape, as shown in FIG. 2A. In another embodiment, the trench-gate structures 200 may have different shapes (not shown). In other embodiments, the trench-gate structures 200 of more than two trench-gate structures 200 may have the same shape or different shapes, and may have the same pitch or different pitches between the adjacent trench-gate structures. It is realized that the number and shape of the trench-gate structures 200 shown in FIGS. 2A to 2C are used as an example and are not limited thereto. The actual number and shape of the trench-gate structures 200 are determined by design demands.

Referring to FIGS. 3A to 3C, a plurality of source-doped regions 300 may be formed in the substrate 100 corresponding to the bulk region 30 by a doping process, such as an ion implantation process, wherein one source-doped region 300 surrounds one trench-gate structure 200, as shown in FIG. 3A. In the embodiment, the conductivity type of the source-doped region 300 is n-type, but it is not limited thereto. In other embodiments, the conductivity type of the source-doped region 300 is p-type and may be determined according to design demands. For example, the source-doped region 300 may comprise p-type dopants, such as boron or boron fluoride, or n-type dopants, such as phosphorous or arsenic. In the embodiment, as viewed from a top view perspective, the sides of the source-doped regions 300 and the trench-gate structure 200 have the same shape, as shown in FIG. 3A. In other embodiments, the sides of the source-doped regions 300 and the trench-gate structure 200 may have different shapes (not shown).

A drain-doped region 400 may be formed in the substrate 100 at a second side opposite to the first side of the field-plate region 20 by a doping process, such as an ion implantation process. Namely, the drain-doped region 400 and the bulk region 30 having the trench-gate structures 200 and the source-doped regions 300 are at two opposite sides of the field-plate region 20, respectively. In the embodiment, the conductivity type of the drain-doped region 400 is p-type, but it is not limited thereto. In other embodiments, the conductivity type of the drain-doped region 400 is n-type and may be determined according to design demands. For example, the drain-doped region 400 may comprise p-type dopants, such as boron or boron fluoride, or n-type dopants, such as phosphorous or arsenic. In the embodiment, as viewed from a top view perspective, an extending direction of length of the trench-gate structure 200 (i.e., the X-direction) is perpendicular to that of the drain-doped region 400 (i.e., the Y-direction), as shown in FIG. 3A.

The driving current 50 of the semiconductor device having trench gates flows from the drain-doped region 400 through below the field-oxide layer 240, and further flows up to at least one corresponding source-doped region 300 along the sidewalls of at least one trench-gate structure 200, as the arrow shows in FIG. 3B. In the embodiment, the gate channel width W of the semiconductor device having trench gates is half of the perimeter of the bottom surface of an elongated pillar of the trench-gate structure 200.

Compared to the trench-gate structure having the extending direction of length parallel to that of the drain-doped region, when the device area is fixed, a trench-gate structure is arranged to have an extending direction of length substantially perpendicular to that of the drain-doped region, a plurality of trench-gate structures could be formed and spaced apart from each other in the semiconductor device. As a result, the gate channel width would be increased to be the sum of half of the perimeter of the bottom surfaces of the trench-gate structures. Therefore, the device area would be used effectively, thereby improving the driving current.

According to the foregoing embodiments, a trench-gate structure has an extending direction of length substantially perpendicular to that of the drain-doped region, and the gate channel width W of the semiconductor device is half of the perimeter of the bottom surface of the elongated pillar of the single trench-gate structure. Therefore, the gate channel width of the trench-gate structure would be significantly improved by partially increasing the device area, thereby improving the driving current and on-resistance. Additionally, when the device area is partially increased, since a plurality of trench-gate structures could be formed and spaced apart from each other in the semiconductor device, the driving current and on-resistance would be further improved and the device area used would be effectively increased. More precisely, according to the embodiments of the trench-gate structures, the size of the gate structure is decreased and the device area used is increased with the same required driving current. Accordingly, size of the semiconductor device is decreased.

The embodiments of a semiconductor device and a method for forming the same according to the invention can be implemented to a laterally diffused metal oxide semiconductor (LDMOS), an N-channel insulated gate bipolar transistor (NIGBT) and various low-voltage, high-voltage and ultra-high voltage elements.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
a substrate having an active region, wherein a field-plate region and a bulk region are in the active region, and the bulk region is at a first side of the field-plate region;
at least one trench-gate structure disposed in the substrate corresponding to the bulk region;
at least one source-doped region in the substrate corresponding to the bulk region, wherein the at least one source doped region surrounds the at least one trench gate structure; and
a drain-doped region in the substrate at a second side opposite to the first side of the field-plate region, wherein an extending direction of length of the at least one trench gate structure is perpendicular to that of the drain-doped region as viewed from a top view perspective.

2. The semiconductor device as claimed in claim 1, wherein the at least one trench gate structure is an elongated pillar, and a bottom surface of the pillar is oval, rounded rectangular, rectangular or polygonal.

3. The semiconductor device as claimed in claim 2, wherein the at least one trench gate structure comprises a gate-electrode layer, and wherein a gate channel width of the semiconductor device is half of a perimeter of the bottom surface.

4. The semiconductor device as claimed in claim 1, wherein the semiconductor device comprises a plurality of trench-gate structures and a plurality of corresponding source- doped regions, and the plurality of trench-gate structures are spaced apart from each other.

5. The semiconductor device as claimed in claim 4, wherein the plurality of trench-gate structures has the same pitch between each other, and has the same pitch between each trench-gate structure and the drain-doped region.

6. The semiconductor device as claimed in claim 4, wherein the plurality of trench-gate structures has different pitches between each other, and has the same pitch between each trench-gate structure and the drain-doped region.

7. The semiconductor device as claimed in claim 4, wherein the plurality of trench-gate structures has the same shape.

8. The semiconductor device as claimed in claim 4, wherein the plurality of trench-gate structures has different shapes.

9. The semiconductor device as claimed in claim 1, wherein the at least one trench gate structure comprises:
a dielectric layer in at least one trench in the substrate; and
a gate-electrode layer on the dielectric layer and fully filling the at least one trench.

10. The semiconductor device as claimed in claim 1, further comprising:
a field-oxide layer in the field-plate region; and
a field electrode on the field-oxide layer and extending onto the substrate corresponding to the bulk region.

11. A method for forming a semiconductor device, comprising:
providing a substrate having an active region, wherein a field-plate region and a bulk region are in the active region, and the bulk region is at a first side of the field-plate region;
forming at least one trench-gate structure and at least one source-doped region in the substrate corresponding to the bulk region, wherein the at least one source doped region surrounds the at least one trench gate structure; and
forming a drain-doped region in the substrate at a second side opposite to the first side of the field-plate region, wherein an extending direction of length of the at least one trench gate structure is perpendicular to that of the drain-doped region as viewed from a top view perspective.

12. The method as claimed in claim 11, wherein the at least one trench gate structure is an elongated pillar, and a bottom surface of the pillar is oval, rounded rectangular, rectangular or polygonal.

13. The method as claimed in claim 12, wherein the at least one trench gate structure comprises a gate-electrode layer, and wherein the gate channel width of the semiconductor device is half of a perimeter of the bottom surface.

14. The method as claimed in claim 11, wherein the semiconductor device comprises a plurality of trench-gate structures and a plurality of corresponding source-doped regions, and the plurality of trench-gate structures is spaced apart from each other.

15. The method as claimed in claim 14, wherein there is the same pitch between each trench-gate structure and the drain-doped region.

16. The method as claimed in claim 14, wherein the plurality of trench-gate structures has different pitches between each other, and has the same pitch between each trench-gate structure and the drain-doped region.

17. The method as claimed in claim 14, wherein the plurality of trench-gate structures has the same shape.

18. The method as claimed in claim 14, wherein the plurality of trench-gate structures has different shapes.

19. The method as claimed in claim 11, wherein the formation of the at least one trench gate structure comprises:
   forming at least one trench in the substrate at the first side of the field-plate region;
   forming a dielectric layer in the at least one trench; and
   forming a gate-electrode layer on the dielectric layer to fully fill the at least one trench.

20. The method as claimed in claim 11, further comprising:
   forming a field-oxide layer in the field-plate region; and
   forming a field electrode on the field-oxide layer that extends onto the substrate corresponding to the bulk region.

* * * * *